United States Patent
Deak et al.

(10) Patent No.: US 11,287,491 B2
(45) Date of Patent: Mar. 29, 2022

(54) MODULATED MAGNETORESISTIVE SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 241 days.

(21) Appl. No.: 16/500,912

(22) PCT Filed: Apr. 4, 2018

(86) PCT No.: PCT/CN2018/081914
§ 371 (c)(1),
(2) Date: Mar. 6, 2020

(87) PCT Pub. No.: WO2018/184565
PCT Pub. Date: Oct. 11, 2018

(65) Prior Publication Data
US 2020/0217908 A1    Jul. 9, 2020

(30) Foreign Application Priority Data
Apr. 5, 2017   (CN) .......................... 201710217942.9

(51) Int. Cl.
*G01R 33/09*    (2006.01)

(52) U.S. Cl.
CPC ......... *G01R 33/093* (2013.01); *G01R 33/096* (2013.01)

(58) Field of Classification Search
CPC ................ G01R 33/093; G01R 33/096; G01R 33/0052; G01R 33/0041; G01R 33/0011; G01R 33/09
See application file for complete search history.

(56) References Cited

U.S. PATENT DOCUMENTS

| | | | |
|---|---|---|---|
| 7,195,945 B1 * | 3/2007 | Edelstein | B82Y 25/00 324/244 |
| 7,573,737 B2 | 8/2009 | Kent et al. | |

(Continued)

FOREIGN PATENT DOCUMENTS

| | | |
|---|---|---|
| CN | 101680740 A | 3/2010 |
| CN | 101896976 A | 11/2010 |

(Continued)

OTHER PUBLICATIONS

"International Application No. PCT/CN2018/081914, International Search Report and Written Opinion dated Jun. 29, 2018", (dated Jun. 29, 2018), 10 pgs.

*Primary Examiner* — Tung X Nguyen
*Assistant Examiner* — Feba Pothen
(74) *Attorney, Agent, or Firm* — Schwegman Lundberg & Woessner, P.A.

(57) ABSTRACT

A modulated magnetoresistive sensor consists of a substrate located on a substrate in an XY plane, magnetoresistive sensing elements, a modulator, electrical connectors, an electrical insulating layer, and bonding pads. The sensing direction of the magnetoresistive sensing elements is parallel to the X axis. The magnetoresistive sensing elements are connected in series into a magnetoresistive sensing element string. The modulator is comprised of multiple elongated modulating assemblies. The elongated modulating assemblies consist of three layers—FM1 layer, NM layer, and FM2 layer. The ends of the elongated modulating assemblies are electrically connected to form a serpentine current path. The electrical insulating layer is set between the elongated modulating assemblies and the magnetoresistive sensing elements to separate the elongated modulating assemblies from the magnetoresistive sensing elements. The current modulates the permeability of the elongated modulating assemblies, and it is regulated in order to keep the modulated (Continued)

signal in the linear range of the magnetoresistive sensors. This technique suppresses sensor noise.

12 Claims, 10 Drawing Sheets

(56) References Cited

U.S. PATENT DOCUMENTS

| | | | |
|---|---|---|---|
| 9,488,496 B2 | 11/2016 | Stanley | |
| 2008/0112094 A1 | 5/2008 | Kent et al. | |
| 2008/0259508 A2 | 10/2008 | Kent et al. | |
| 2009/0315548 A1* | 12/2009 | Bonin | G01R 33/0023 324/244 |
| 2010/0321014 A1 | 12/2010 | Butzmann | |
| 2014/0070798 A1 | 3/2014 | Stanley | |
| 2015/0022193 A1* | 1/2015 | Burdette | G01R 33/06 324/239 |
| 2016/0109535 A1* | 4/2016 | Deak | G01R 17/105 324/252 |
| 2016/0327616 A1 | 11/2016 | Deak | |
| 2019/0346514 A1* | 11/2019 | Deak | G01R 33/09 |

FOREIGN PATENT DOCUMENTS

| | | |
|---|---|---|
| CN | 103645449 | 3/2014 |
| CN | 103675756 A | 3/2014 |
| CN | 107037382 A | 8/2017 |
| CN | 207081821 U | 3/2018 |
| JP | 2010078401 A | 4/2010 |
| WO | WO-2018184565 A1 | 10/2018 |

* cited by examiner

MODULATED MAGNETORESISTIVE SENSOR

PRIORITY CLAIM TO RELATED APPLICATIONS

This application is a U.S. national stage filing under 35 U.S.C. § 371 from International Application No. PCT/CN2018/081914, filed on 4 Apr. 2018, and published as WO2018/184565 on 11 Oct. 2018, which claims the benefit under 35 U.S.C. 119 to Chinese Application No. 201710217942.9, filed on 5 Apr. 2017, the benefit of priority of each of which is claimed herein, and which applications and publication are hereby incorporated herein by reference in their entirety.

TECHNICAL FIELD

The present invention relates to a magnetoresistive sensor, and more particularly to a modulated magnetoresistive sensor.

BACKGROUND ART

Since magnetoresistive sensors are restricted by the 1/f noise, the resolution is limited at low frequency. Techniques for modulating magnetic field sensors have been developed to convert measurement signals to those with a higher frequency relative to the sensor's inherent noise, such that the influence from the 1/f noise of sensors may be avoided.

In the prior art, the use of a magnetic flux concentrators is known. This includes using a MEMS structure to move a magnetic flux concentrator in an oscillating manner relative to a sensor. It further includes using large magnetic flux concentrators provided outside the sensor package, in which the permeability of the magnetic flux concentrator is modulated using a coil disposed around the magnetic flux concentrator.

In the two cases described above, the purpose is to periodically change the magnetic field to be measured, which is then sensed by the sensor. A modulation method modulates the output signal of a sensor, which will convert the sensor signal to one with a higher frequency, such that the noise of the sensor becomes smaller.

The modulating magnetic field must be sufficiently small enough such that it does not introduce noise in the sensor elements. This is because modulating a sensor with a large periodic magnetic field can cause Barkhausen noise if the amplitude is large enough, and it may also produce nonlinear modulation of the sensor sensitivity. Nonlinear modulation mixes the low frequency thermomagnetic noise of the sensor into the sideband of the modulated signal. When a small modulating magnetic field is present at the sensor, the best noise reduction and hence the best signal-to-noise ratio are produced, which also correspond to the peak amplitude of a detected signal.

In addition, noise reduction is beneficial for reducing the 1/f noise of the sensor, which is achieved based on the following factors: proper sensor bias; appropriate sensor material; and adequate sensor size.

Finally, in the case of modulation at a sufficiently high frequency, the input signal occurs in a white noise region of the sensor; the resistance of the sensor is low, causing low Johnson noise; the sensitivity of the sensor is high, causing small equivalent input noise; the sensor is biased according to a certain voltage or current, which does not cause shot noise; and the shot noise exceeds the sensor's thermal Johnson noise and then noise reduction is maximized.

The modulation methods in the prior art are: moving the magnetic flux concentrator or moving the sensor relative to the magnetic flux concentrator, which are both too complicated and costly; placing the sensor in a large shield and periodically permeating the shield; however, in this method, the shield is placed outside the sensor, which causes a large size and high costs.

SUMMARY OF THE INVENTION

In order to solve the above technical problems, the present invention proposes a modulated magnetoresistive sensor. The present invention is implemented by the following technical solutions.

A modulated magnetoresistive sensor having a substrate disposed on an XY plane, wherein magnetoresistive sensing elements, a modulator, electrical connectors, an electrically insulating layer, and bonding pads are all deposited on the substrate, and the sensing direction of the magnetoresistive sensing elements is parallel to the X axis;

the magnetoresistive sensing elements are connected in series to form magnetoresistive sensing element strings, the magnetoresistive sensing element strings are electrically connected to form a sensor bridge which is a push-pull half-bridge circuit or a push-pull full-bridge circuit; the magnetoresistive sensing element strings are electrically connected to the bonding pads such that a bias voltage or current flows through the magnetoresistive sensing elements and the voltage or current on the magnetoresistive sensing elements is detected;

the modulator is electrically connected to the bonding pads, a modulating current is obtained from the bonding pads, the direction of the modulating current is parallel to the Y axis, the modulator causes the modulating current to pass through a conductor around a soft ferromagnetic flux concentrator so that a magnetic field is generated around the soft ferromagnetic flux concentrator to modulate the permeability of the soft ferromagnetic flux concentrator, and an electrically insulating layer is set between the modulator and the magnetoresistive sensing elements to separate the modulator from the magnetoresistive sensing elements.

Preferably, the magnetoresistive sensing elements are AMR, GMR, or TMR magnetic sensing elements; the modulator is composed of multiple elongated modulating assemblies, each of the elongated modulating assemblies is in the structure of a rectangular strip with a long axis parallel to the Y-axis direction and a short axis parallel to the X-axis direction, the multiple elongated modulating assemblies are arranged in an array, there are gaps between the elongated modulating assemblies, the direction of spacing distance of the gaps is along the X-axis direction; and the ends of the elongated modulating assemblies are connected by the electrical connectors to form a serpentine current path.

Preferably, each of the elongated modulating assemblies are a three-layer structure consisting of a FM1 layer, a NM layer, and a FM2 layer, wherein the FM1 layer and the FM2 layer are soft ferromagnetic layers, and the NM layer is a normal metal layer;

The NM layer is made of tantalum or copper, the thickness of the NM layer is less than 5 nm, and antiferromagnetic RKKY coupling exists between the FM1 layer and the FM2 layer.

Preferably, the electrical connectors are made of a metal, and the electrical connectors are connected to an upper surface, lower surface or side surface of the modulator;

Alternatively, the electrical connectors are etched from the three-layer structures each consisting of an FM1 layer, an NM layer, and an FM2 layer.

Preferably, the modulator includes a current carrying coil and a rectangular ferromagnetic body, the current carrying coil is located above the rectangular ferromagnetic body, and the current carrying coil is connected to a bonding pad.

Preferably, the sensor further includes an AC reference power supply; the AC reference power supply periodically drives the elongated modulating assemblies in the sensor, an analog front end circuit, a low pass filter and a mixer at a frequency f; the analog front end circuit includes a front end circuit and an amplifier, and the front end circuit is capacitively coupled to an output terminal of the magnetoresistive sensor; an input terminal of the mixer is electrically connected to the AC reference power supply and an output terminal of the front end circuit; an input terminal of the low pass filter is electrically connected to an output terminal of the mixer, an output terminal of the low pass filter provides an output signal, and the output signal corresponds to the amplitude and polarity of a magnetic field detected by the magnetoresistive sensing elements.

Preferably, the sensor further includes an optimized filter electrically connected to an AC reference power signal or an input signal of the mixer; the optimized filter adjusts the reference power signal by removing a portion of frequency components before the AC reference power signal enters a mixer circuit and by converting the AC reference power signal into an AC voltage signal.

Preferably, the AC reference power signal is unipolar, the low pass filter is connected to an output terminal of the mixer, and the low pass filter has a low-frequency cutoff frequency of F.

Preferably, the AC reference power signal is bipolar, the magnetoresistive sensor further includes a frequency multiplier, the frequency multiplier is electrically connected with the AC reference power supply and the input terminal of the mixer, the low pass filter is connected with the output terminal of the mixer, and the low pass filter has a low-frequency cutoff frequency of 2F.

Preferably, the sensor bridge includes a single chip, and bridge arms constituting the sensor bridge are deposited on the single chip; or the sensor bridge includes two or more interconnected chips, each independent chip includes a magnetoresistive sensing element string, and the magnetoresistive sensing element strings are electrically connected to form one or more bridge arms of the sensor bridge.

Preferably, when the AC reference power signal is in an operating frequency range, the magnetoresistive sensor elements produce white noise with a frequency that is much greater than the frequency of 1/f noise.

Preferably, the FM1 layer and the FM2 layer have different remanent moment products Mrt. When there is no external magnetic field, even if the AC reference power signal is the largest, the magnetic field generated by the modulating current at the sensor location is also the smallest.

Compared with the prior art, the modulated magnetoresistive sensor of the present invention has the following technical features:

The present invention uses an RKKY coupled FM stack form to change the permeability of the magnetoresistive sensor by a modulating current from the modulator, and thereby modulate the magnetic field; the present invention is capable of carrying out signal modulation prior to detection by the sensor elements, and the modulating current can keep the modulating signal in a corresponding linear range of the magnetoresistive sensor; and magnetic field modulation and noise suppression are further achieved by changing the permeability.

BRIEF DESCRIPTION OF THE DRAWINGS

In order to more clearly illustrate the technical solutions in the embodiments of the present invention or in the prior art, drawings to be used for description of embodiments and the prior art will be introduced briefly hereinafter. Obviously, drawings referred to in the following description are merely some embodiments of the present invention, and those skilled in the art may also conclude other drawings based on these drawings without creative efforts.

DETAILED DESCRIPTION

To make the objectives, technical solutions, and advantages of embodiments of the present invention clearer, the technical solutions in the embodiments of the present invention will be described clearly and completely below with reference to the accompanying drawings in the embodiments of the present invention. It is apparent that the described embodiments are some rather than all the embodiments of the present invention. All other embodiments obtained by a person of ordinary skill in the art based on the embodiments of the present invention without creative efforts shall fall within the scope of the present invention.

Figure 1:
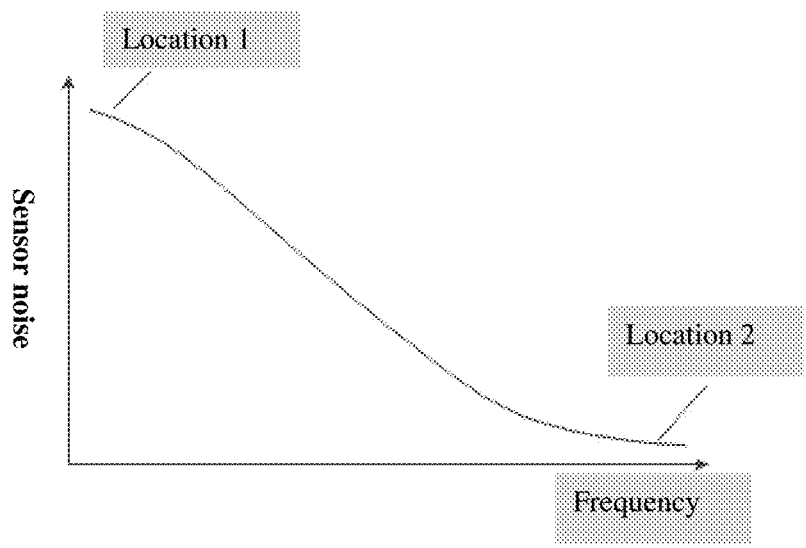
FIG. 1 is a schematic diagram showing the relationship between the frequency of a modulating signal and sensor noise.

FIG. 1 is a schematic diagram showing the relationship between the frequency of a modulating signal and sensor noise; specifically, at Location1, a low frequency signal has greater noise, in which case a DC signal has a very low resolution; at Location 2, if the DC signal is shifted to a white noise range at a certain frequency, it will be a very ideal state.

Figure 2:
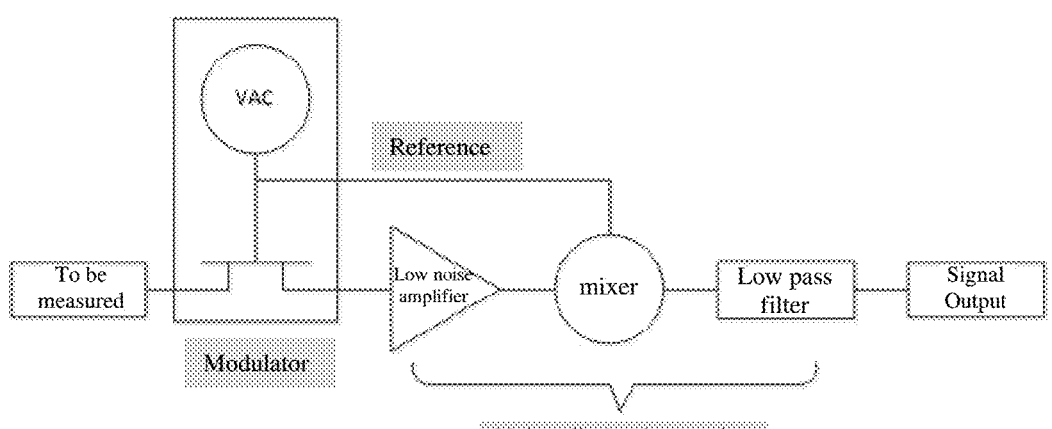
FIG. 2 is a schematic diagram of a standard signal modulation technique.

FIG. 2 is a schematic diagram of a standard modulation technique that ideally eliminates noise from a noise amplifier, a mixer, and a low-pass filter. This modulator needs to first modulate low-noise circuit components and modulate the sensor by applying an alternating voltage bias or alternating magnetic field signal to the sensor, which can be used as a method of separating the desired signal from the noise of the sensor, but this method cannot remove the sensor noise.

Resistance noise refers to random and irregular fluctuations of resistance in a device. In the present application, the resistance noise is defined as $R_{noise}(\omega)$. When a current flows through a device, the resistance noise will appear as voltage noise. Further, the voltage noise refers to random and irregular fluctuations of voltage in a device and is defined as $V_{noise}(\omega)$ in the present application.

For a device, it is very likely that there is only voltage noise but no current flowing. Therefore, a device may have a balanced voltage but no resistance noise, and Johnson noise is an example. The device may also have voltage noise independent of the bias current, and Johnson noise is also an example.

Figure 3:
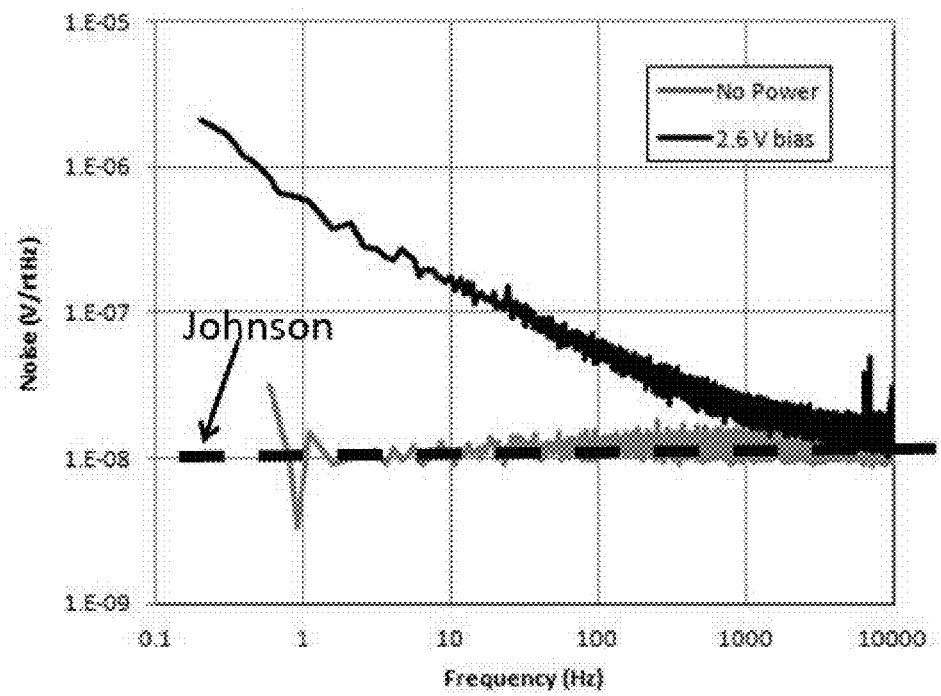
FIG. 3 is a schematic diagram showing changes in Johnson noise and 1/f noise with frequency.

FIG. 3 is a schematic diagram showing changes in Johnson noise and 1/f noise with frequency. The magnitude of the Johnson noise does not change as the bias current changes, and the 1/f voltage noise changes with the bias current.

Johnson spectral noise density is $V_{noise}(\omega) \approx \sqrt{4k_B TR}$. It should be noted that the noise here is voltage noise, which is independent of the frequency in the figure, wherein the resistance R of the sensor is 5K ohms, corresponding to 10 nV/rtHz.

The 1/f noise is large at a low frequency, and the amplitude of the 1/f noise is determined by the bias voltage, and Johnson noise is independent of it; the 1/f noise is present in the form of resistance fluctuations, wherein there are many possible mechanisms of action; however, for sensor design, the noise is in the form of resistance fluctuations, which determines how it is suppressed, and the specific mechanism of action is not important.

An analysis is given below to demonstrate that bias modulation for a sensor does not work: assuming that the sensor output is a combination of a signal and noise:

$$V_{out}(\omega) = H(\omega)S + V_{noise}(\omega) + \alpha_0 H(\omega) \cdot V_{noise}(\omega) + \alpha_1 H^2(\omega) \cdot V_{noise}(\omega) + \alpha_2 H(\omega) * V^2_{noise}(\omega) + \ldots$$

where, H refers to the measured magnetic field, S refers to sensitivity, $V_{noise}(\omega)$ refers to random sensor noise, al refers to the nonlinear coefficient of the signal, and i is a positive number greater than or equal to 1.

Under a limit, $V_{out}(\omega) \approx H(\omega)S + V_{noise}(\omega)$;

It may be considered to modulate the sensor bias to change the sensitivity, then, $V_{out}(\omega) \approx H(\omega)S(I_{bias}(\omega_c)) + V_{noise}(\omega, I_{bias}(\omega_c))$ However, the 1/f noise occurs in the form of resistance noise, and the magnitude of the resistance noise depends on the bias current flowing through the sensor elements:

$$V_{out}(\omega) \approx H(\omega)S(I_{bias}(\omega_c)) + R_{noise}(\omega)I_{bias}(\omega_c) + \ldots$$

Therefore, when the sensor is modulated at $\omega_c$, then
$V_{out}(\omega - \omega_c) - V_{out}(\omega + \omega_c) \approx H(\omega)\{S(I_{bias}(0)) - S(I_{bias}(2\omega_c))\} + R_{noise}(\omega)\{I_{bias}(0) - I_{bias}(2\omega_c)\} + \ldots$, then let the bias current to pass through the low-pass filter at $\omega_c$, no reduction of the 1/f noise is seen, $$V_{out}(\omega - \omega_c) \approx H(\omega)S(I_{bias}(0)) + R_{noise}(\omega)I_{bias}(0) + \ldots$$

$$V_{out}(\omega - \omega_c) \approx H(\omega)S + V_{noise}(\omega) + \ldots$$

Therefore, it can be seen that the 1/f noise cannot be reduced by modulating sensor bias, and thus the sensor generates resistance noise.

The modulation is performed below in a modulation manner, assuming that the sensor output is a nonlinear combination of a signal and noise, and the sensor is DC biased, then $V_{out}(\omega) = H(\omega)S + V_{noise}(\omega) + \alpha_0 H(\omega) \cdot V_{noise}(\omega) + \alpha_1 H^2(\omega) \cdot V_{noise}(\omega) + \alpha_2 H(\omega) \cdot V^2_{noise}(\omega) + \ldots$, where, H refers to the measured magnetic field, S refers to sensitivity, $V_{noise}(c)$ refers to random sensor noise, $\alpha_1$ refers to the nonlinear coefficient of the signal, and i is a positive number greater than or equal to 1.

Under the limit, the noise and the magnetic field that can be measured are independent of each other, $$V_{out}(\omega) \approx H(\omega)S + V_{noise}(\omega)$$

It is assumed that the magnetic field input is modulated at $\omega_c$ before the sensor detects the magnetic field, then $$V_{out}(\omega) = H(\omega + \omega_c)S + V_{noise}(\omega),$$

$V_{out}$ is mixed at co, then,
$V_{out}(\omega - \omega_c) - V_{out}(\omega + \omega_c) \approx \{-H(2\omega_c) + H(\omega)\}S - V_{noise}(\omega + \omega_c) + V_{noise}(\omega - \omega_c) + \ldots$ finally let the current to pass through the low pass filter, then, $$V_{out}(\omega - \omega_c) \approx H(\omega)S + V_{noise}(\omega - \omega_c) + \ldots$$

Thus, the noise is turned to a negative frequency with respect to the detected signal.

Figure 4:
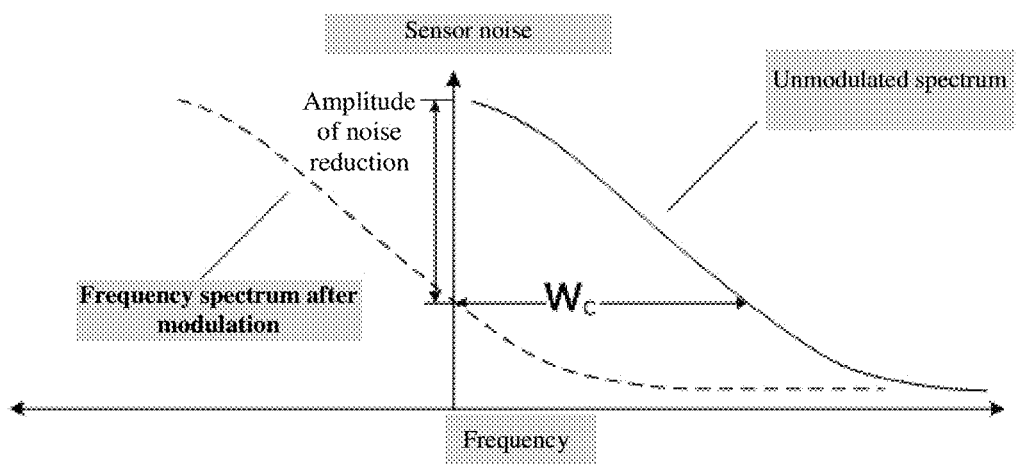
FIG. 4 is a schematic diagram of signal modulation and noise offset.

FIG. 4 is a schematic diagram of signal modulation and noise offset; the modulated frequency spectrum offset is shifted to a low frequency at a frequency $\omega_c$, resulting in the reduction of low frequency noise. If a high modulation magnetic field is used, nonlinearity causes sensor noise to mix into the modulated sideband, which reduces the amount of noise reduction.

In order for ensure the operation of any modulation structure, the modulator modulates the signal to be measured rather than necessarily modulating the 1/f noise of the sensor, and it still can achieve a frequency offset between the signal and the noise and reduce the 1/f noise output by the system.

Figure 5:
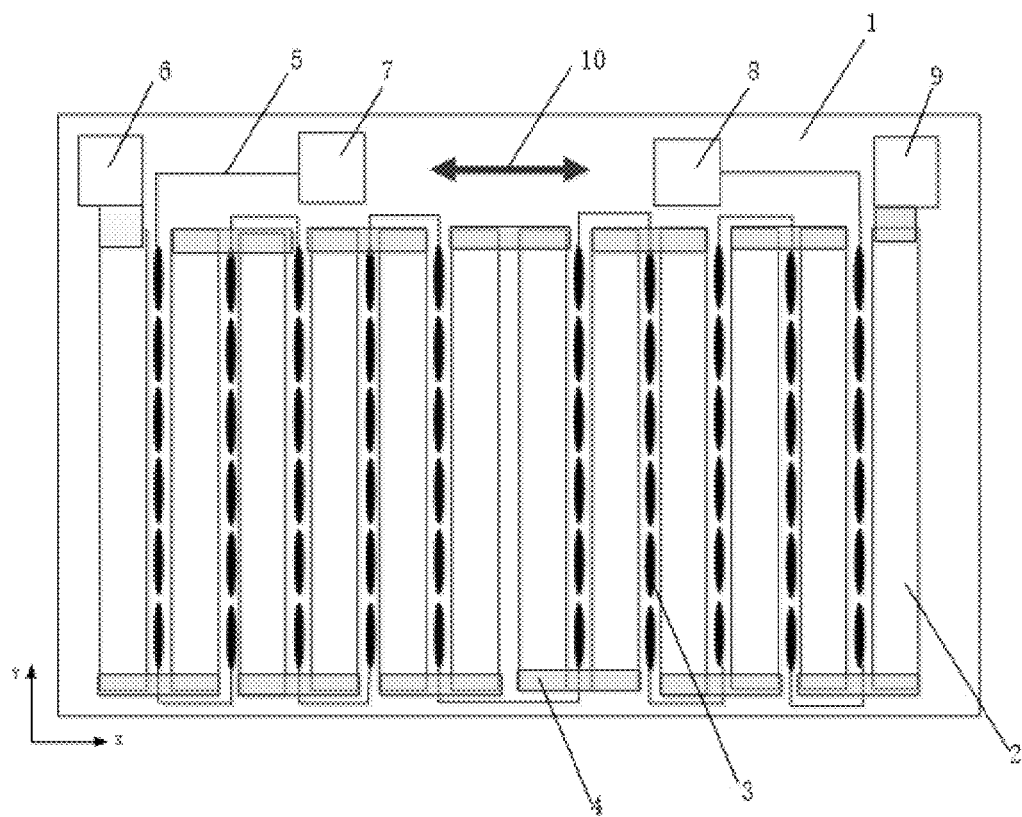
FIG. 5 is a schematic structural diagram of a modulated magnetoresistive sensor according to the present invention.

FIG. 5 is a schematic structural diagram of a modulated magnetoresistive sensor according to the present invention; as shown in FIG. 5, a substrate 1 is disposed on an XY plane, magnetoresistive sensing elements 3, elongated modulating assemblies 2, electrical connectors 4, sensor connectors 5, a bonding pad 6, a bonding pad 7, a bonding pad 8, a bonding pad 9 and the like are deposited on the substrate 1, and the sensing direction of the magnetoresistive sensing elements 3 are parallel to the X axis;

The magnetoresistive sensing elements 3 are connected in series to form magnetoresistive sensing element strings, the magnetoresistive sensing element strings are electrically connected to form a sensor bridge; the magnetoresistive sensing element strings are electrically connected with the bonding pad 7 and the bonding pad 8 through the sensor connectors 5 such that a bias voltage or current flows through the magnetoresistive sensing elements 3 and the voltage or current on the magnetoresistive sensing elements 3 is detected; the multiple elongated modulating assemblies 2 are arranged in an array, there are gaps between the elongated modulating assemblies 2, the direction of spacing distance of the gaps is along the X-axis direction; the elongated modulating assemblies 2 are electrically connected with the bonding pads, the modulating current which is in parallel with the Y-axis direction passes through the bonding pads; and the ends of the elongated modulating assemblies 2 are connected by the electrical connectors 4 to form a serpentine current path.

The magnetoresistive sensing elements 3 here are AMR, GMR, or TMR magnetic sensing elements. The magnetoresistive sensing element strings are electrically connected to form a push-pull half-bridge circuit, or the magnetoresistive sensing element strings are electrically connected to form a push-pull full-bridge circuit.

Figure 6:
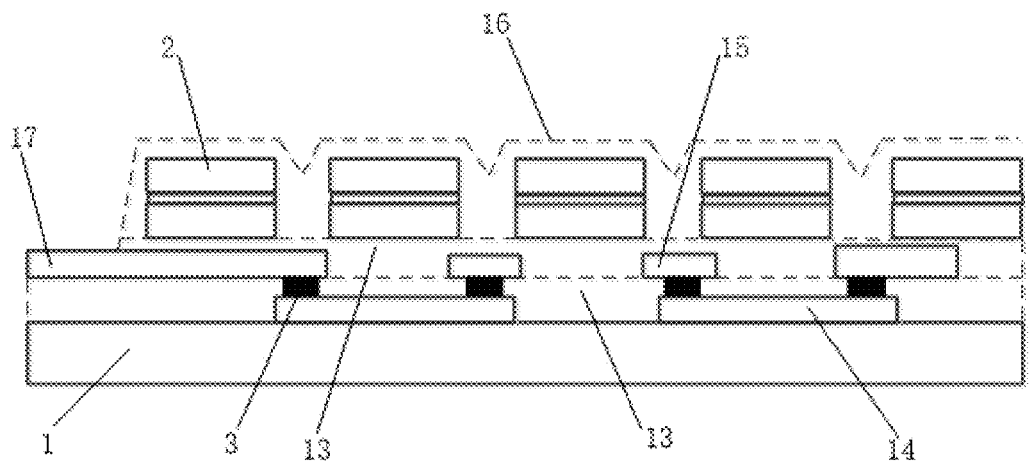
FIG. 6 is a cross-sectional view of a modulated magnetoresistive sensor according to the present invention.

FIG. 6 is a cross-sectional view of a modulated magnetoresistive sensor according to the present invention. A passivation protective layer 16 is deposited on the elongated modulating assemblies 2, upper electrodes 15 are deposited on the magnetoresistive sensing elements 3, bottom electrodes 14 are deposited under the magnetoresistive sensing elements 3, the bottom electrodes 14 are connected with the substrate 1, an electrically insulating layer 13 is set between the elongated modulating assemblies 2 and the magnetoresistive sensing elements 3 to separate the elongated modulating assemblies 2 from the magnetoresistive sensing element 3. An electrically insulating layer is also set between the magnetoresistive sensing elements 3 and the substrate 1, and the number 17 in the figure refers to a bonding pad.

Figure 7:
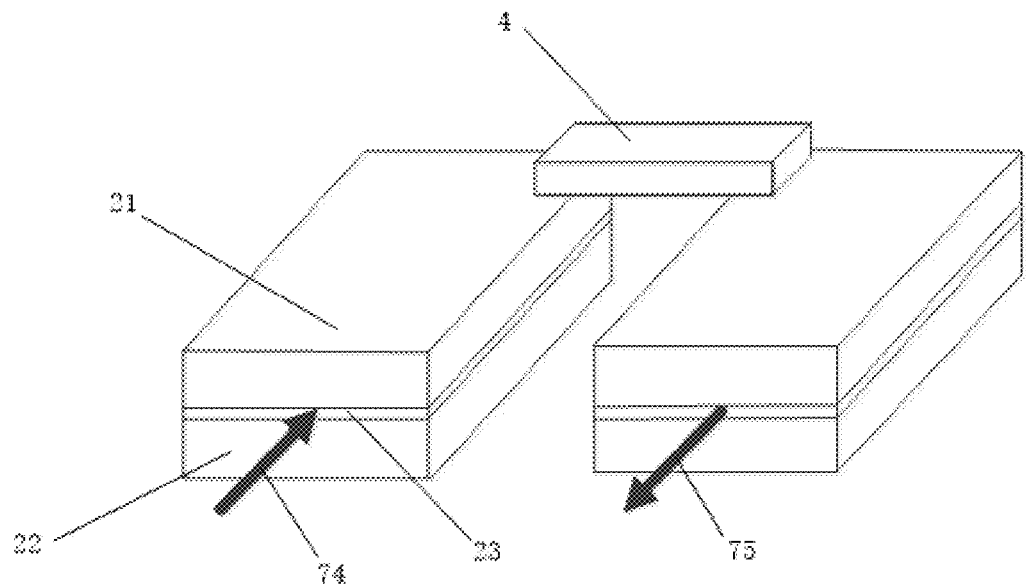
FIG. 7 is a schematic structural diagram of an elongated modulating assembly according to the present invention.
Figure 8:
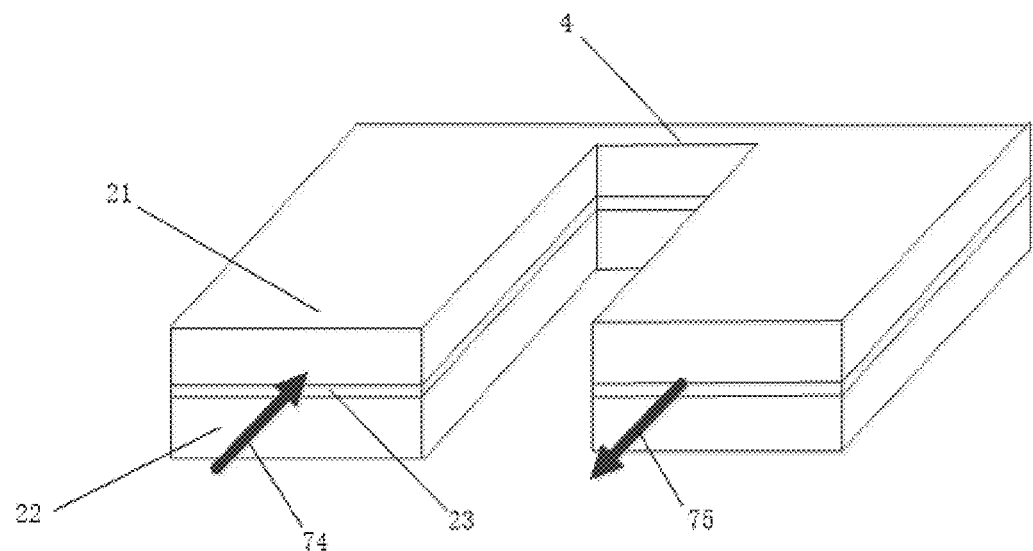
FIG. 8 is a schematic structural diagram of another elongated modulating assembly according to the present invention.

FIG. 7 is a schematic structural diagram of an elongated modulating assembly, and FIG. 8 is a schematic structural diagram of another elongated modulating assembly. Each of the elongated modulating assemblies 2 is a three-layer structure of an FM1 layer 21, an NM layer 22 and an FM2 layer 23, wherein the FM1 layer and the FM2 layer are soft ferromagnetic layers, and the NM layer is a normal metal layer. Each of the elongated modulating assemblies 2 is in the structure of a rectangular strip with a long axis parallel to the Y-axis direction and a short axis parallel to the X-axis direction. The multiple elongated modulating assemblies 2 are arranged in an array, there are gaps between the elongated modulating assemblies, and the direction of spacing distance of the gaps is along the X-axis direction. Arrows 74 and 75 in the figure indicate the inflow and outflow of current, respectively.

Preferably, in each of the elongated modulating assemblies 2, the NM layer is made of tantalum or copper, the thickness of the NM layer is less than 5 nm, and antiferromagnetic RKKY coupling exists between the FM1 layer and the FM2 layer.

The difference between FIG. 7 and FIG. 8 is in that: the electrical connector 4 in FIG. 7 preferably is a metal conductor element, and is connected with the upper surfaces, lower surfaces or side surfaces of the elongated modulating assemblies 2; however, the electrical connector 4 in FIG. 8 is etched from the three-layer structures each consisting of an FM1 layer, an NM layer, and an FM2 layer.

Since the metal layers have higher conductivity than the FM1 layers and the FM2 layers, the current in the elongated modulating assemblies is concentrated in the middle layers of the elongated modulating assemblies; when the current is very large, the FM1 layers and the FM2 layers reduce the permeability of the modulator in a direction parallel to the sensing direction of the sensor elements. High permeability here means that the magnetic flux concentrated on the sensor string is high, and conversely, low permeability means that the magnetic flux concentrated on the sensor string is low. Therefore, by causing an alternating current to pass through the modulator, the external magnetic field may be modulated by changing the permeability.

The FM1 layers and the FM2 layers of the modulator require the same remanent moment product (Mrt) so that they can compensate each other between the modulators, however, since the bottom FM2 layers of the elongated modulating assemblies are close to the magnetoresistive sensing elements. Therefore, the remanent moment of the top FM1 layers is higher than that of the bottom FM2 layers. Moreover, the ends of the elongated modulating assemblies are electrically interconnected, and the modulating current can flow through the elongated modulating assemblies in a serpentine manner, and the unevenness caused by the mismatch between FM1 and FM2 can be overcome in the entire magnetoresistive sensing element region.

Figure 9:
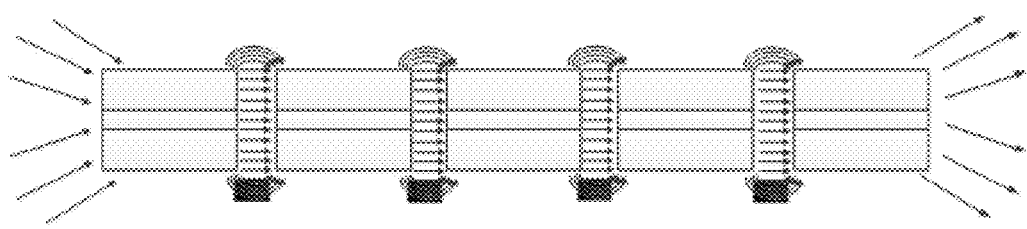
FIG. 9 is a schematic diagram showing a magnetic field distribution of elongated modulating assemblies without modulating current according to the present invention.
Figure 10:
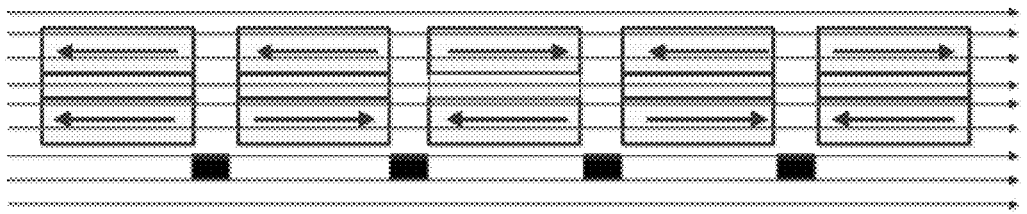
FIG. 10 is a schematic diagram showing a magnetic field distribution of elongated modulating assemblies with modulating current according to the present invention.

FIG. 9 is a schematic view showing a magnetic field distribution of elongated modulating assemblies without modulating current, and the magnetic field generated by the elongated modulating assemblies is concentrated at the magnetoresistive sensing elements. FIG. 10 is a schematic diagram showing a magnetic field distribution of elongated modulating assemblies with modulating current. As is apparent from the figure, when a modulating current is applied, there is no concentration of a magnetic field at the magnetoresistive sensing elements.

Figure 11:
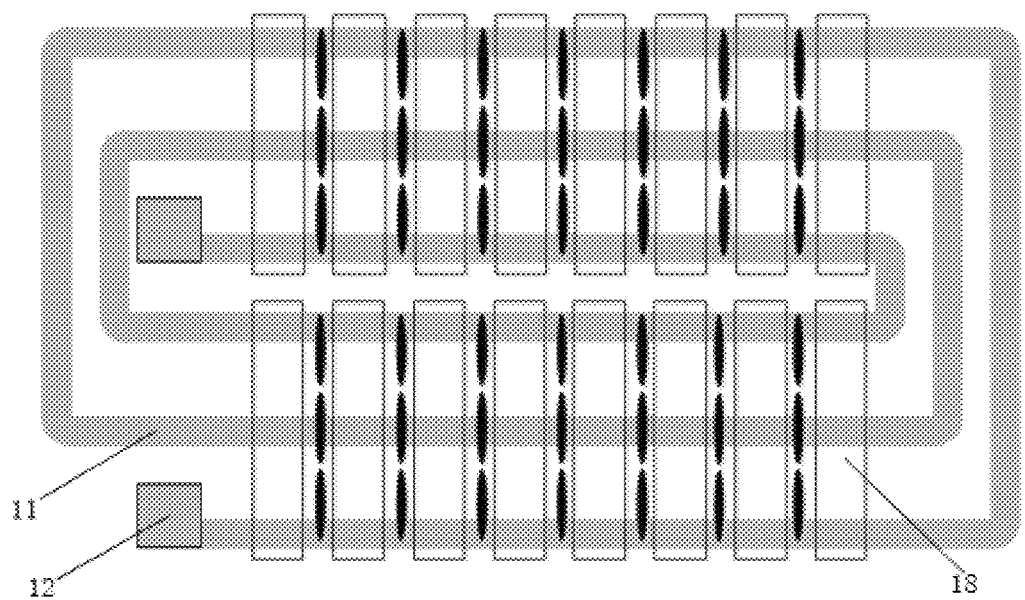
FIG. 11 is a schematic structural diagram of a modulator of the modulated magnetoresistive sensor according to the present invention.

FIG. 11 is another schematic structural diagram of a modulator of the modulated magnetoresistive sensor according to the present invention. As shown in FIG. 11, the modulator of the modulated magnetoresistive sensor includes a current carrying coil 11 and a rectangular ferromagnetic body 18, the current carrying coil 11 is located above the rectangular ferromagnetic body 18, and the current carrying coil 11 is connected to a bonding pad 12.

Figure 12:
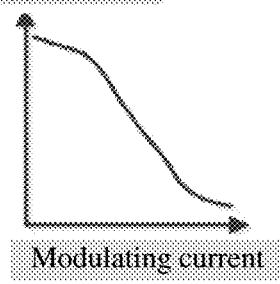
FIG. 12 is a schematic diagram showing the relationship between the permeability of the sensor axis and the modulating current.
Figure 13:
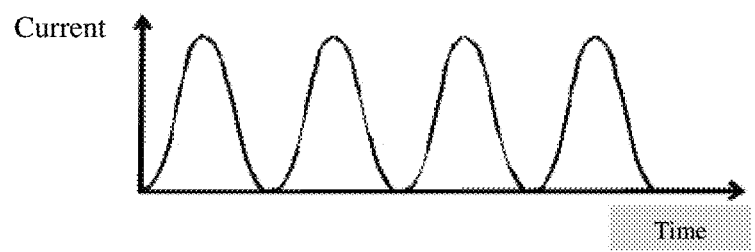
FIG. 13 is a waveform diagram of an applied modulating current.
Figure 14:
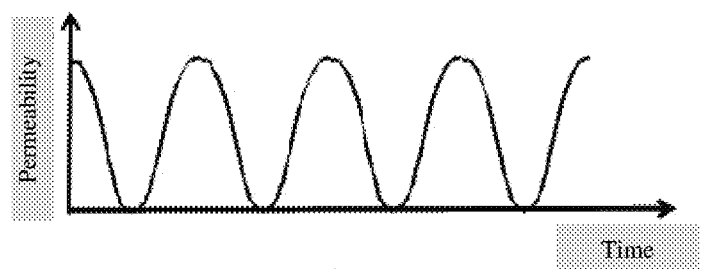
FIG. 14 is a waveform diagram showing permeability change.
Figure 15:
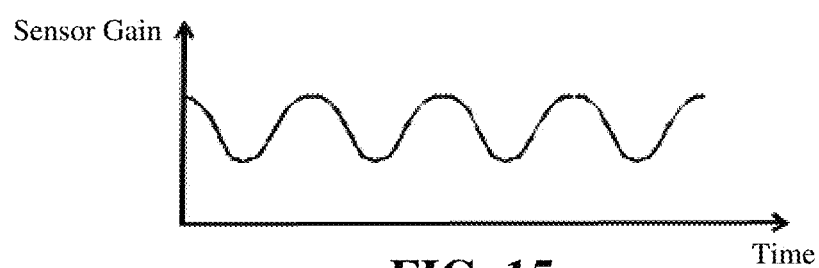
FIG. 15 is a waveform diagram of sensor gain.

FIG. 12 is a schematic diagram showing the change of the permeability of the sensor axis with the modulating current; as the modulating current increases, the permeability of the magnetic sensor shaft decreases, and a modulating alternating current is applied. FIG. 13 is a waveform diagram of an applied modulating current. As seen from FIG. 13, the applied current is a sinusoidal signal; the magnitude of the permeability is in inverse proportion to the current. As shown in FIG. 14, FIG. 14 is a waveform diagram showing permeability change. As the magnetic field gain changes with the permeability, the sensor gain waveform is further obtained, as shown in FIG. 15.

Figure 16:
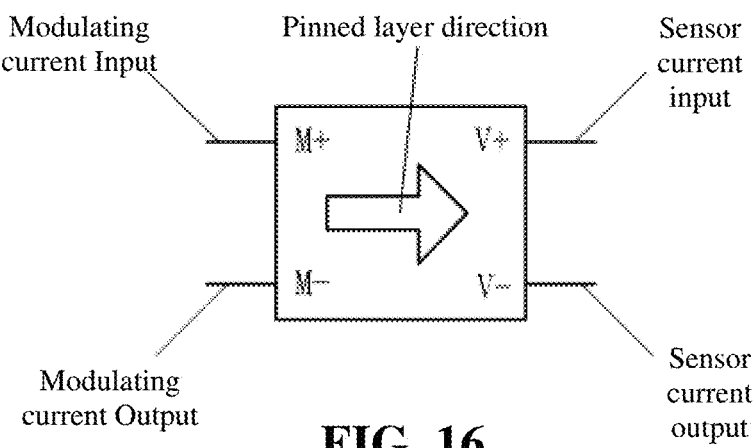
FIG. 16 is a schematic diagram of input and output of a modulated magnetoresistive sensor.

FIG. 16 is a schematic diagram of input and output of a modulated magnetoresistive sensor which includes a modulating current input terminal, a modulating current output terminal, a sensor current input terminal, and a sensor current output terminal. The direction of the arrow in the figure is a pinned layer direction.

The present invention further includes an AC reference power supply; the AC reference power supply periodically drives the elongated modulating assemblies in the sensor, an analog front end circuit, a low pass filter and a mixer at a frequency f; the analog front end circuit includes a front end circuit and an amplifier, and the front end circuit is capacitively coupled to an output terminal of the magnetoresistive sensor; an input terminal of the mixer is electrically connected to the AC reference power supply and an output terminal of the front end circuit; an input terminal of the low pass filter is electrically connected to an output terminal of the mixer, an output terminal of the low pass filter provides an output signal, and the output signal corresponds to the amplitude and polarity of a magnetic field detected by the magnetoresistive sensing elements.

Figure 17:
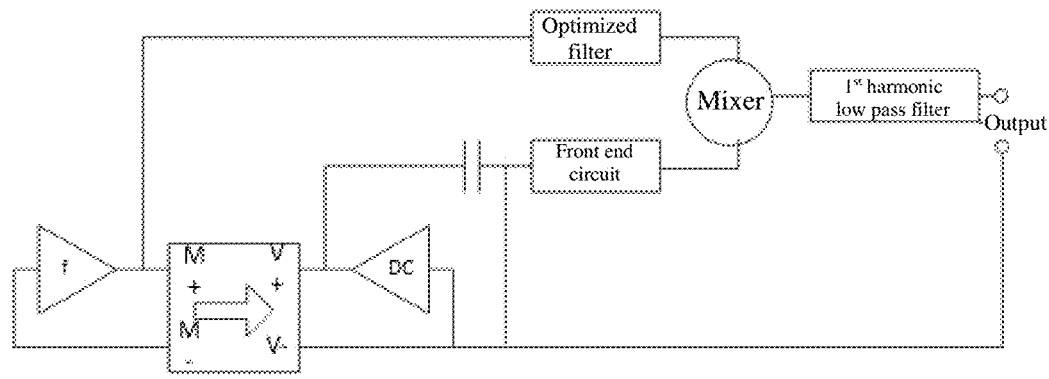
FIG. 17 is a schematic diagram of a unipolar first harmonic application of a single magnetoresistive circuit according to the present invention.
Figure 18:
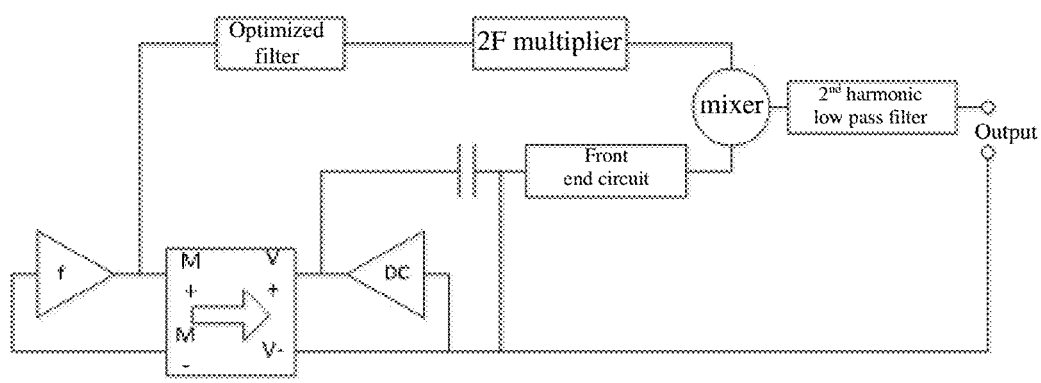
FIG. 18 is a schematic diagram of a bipolar second harmonic application of a single magnetoresistive circuit according to the present invention.
Figure 19:
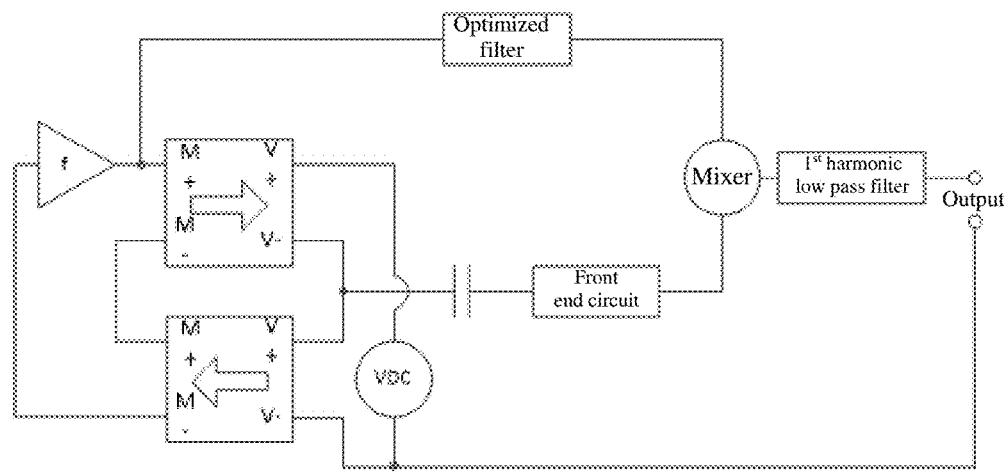
FIG. 19 is a schematic diagram of a unipolar first harmonic application of a half-bridge circuit according to the present invention.
Figure 20:
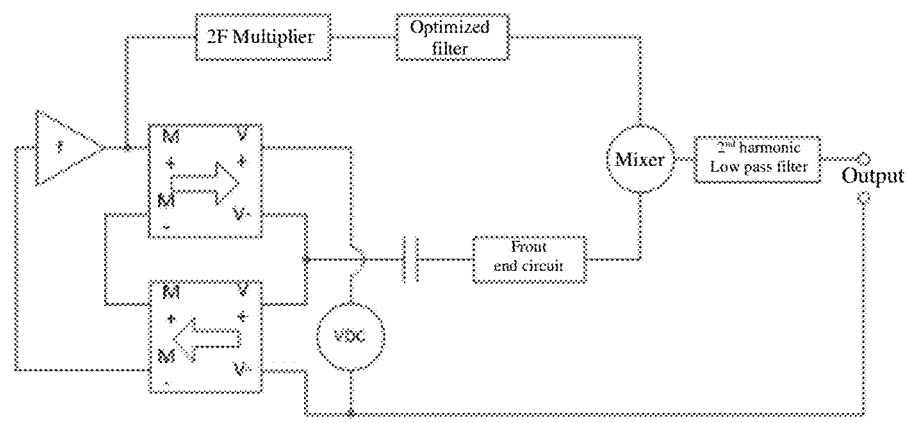
FIG. 20 is a schematic diagram of a bipolar second harmonic application of a half-bridge circuit according to the present invention.
Figure 21:
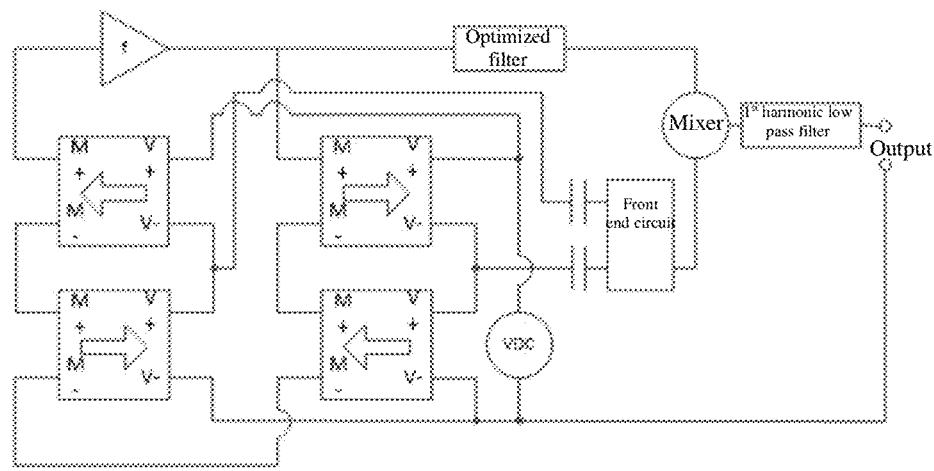
FIG. 21 is a schematic diagram of a unipolar first harmonic application of a full-bridge circuit according to the present invention.
Figure 22:
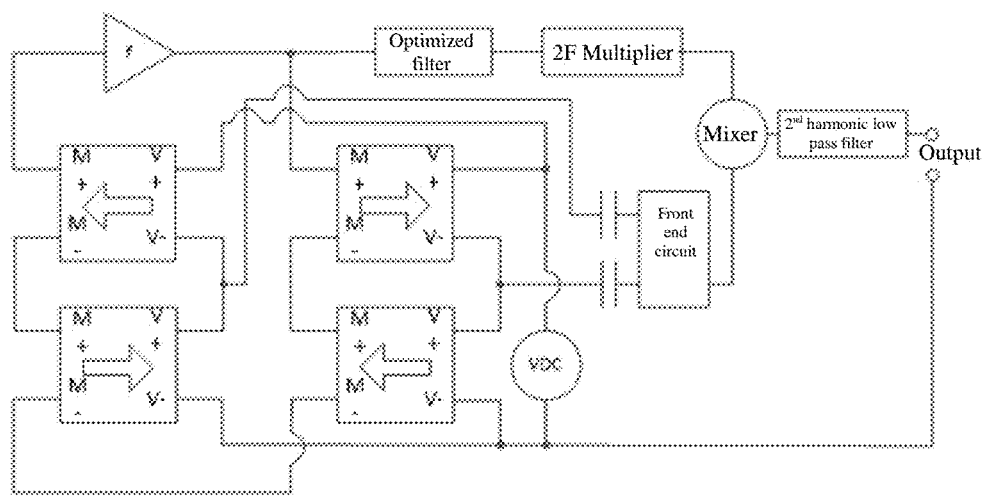
FIG. 22 is a schematic diagram of a bipolar second harmonic application of a full-bridge circuit according to the present invention.

FIG. 17 is a schematic diagram of a unipolar first harmonic application of a single magnetoresistive circuit. FIG. 18 is a schematic diagram of a bipolar second harmonic application of a single magnetoresistive circuit. FIG. 19 is a schematic diagram of a unipolar first harmonic application of a half-bridge circuit. FIG. 20 is a schematic diagram of a bipolar second harmonic application of a half-bridge circuit. FIG. 21 is a schematic diagram of a unipolar first harmonic application of a full-bridge circuit. FIG. 22 is a schematic diagram of a bipolar second harmonic application of a full-bridge circuit.

The AC reference power signal in FIG. 17 is unipolar. The low pass filter is connected to the output terminal of the mixer, and the low pass filter is a $1^{st}$ harmonic low pass filter having a low-frequency cutoff frequency of F.

An optimized filter is further included in FIG. 17 and is electrically connected to an AC reference power supply or an input signal of the mixer; the optimized filter adjusts the reference power signal by removing a portion of frequency components before the AC reference power signal enters a mixer circuit and by converting the AC reference power signal into an AC voltage signal.

In FIG. 18, the AC reference power signal is bipolar, the magnetoresistive sensor further includes a frequency multiplier, the frequency multiplier is electrically connected with the AC reference power supply and the input terminal of the mixer, the low pass filter is connected with the output terminal of the mixer, and the low pass filter is a $2^{nd}$ harmonic low pass filter having a low-frequency cutoff frequency of 2F.

FIG. 19 and FIG. 20 respectively form a half-bridge circuit using two magnetoresistive circuit elements. FIG. 21 and FIG. 22 respectively form a full-bridge circuit using four magnetoresistive circuit elements, and its specific working principle is similar to the above. The sensor bridge includes two or more interconnected chips, each independent chip includes a magnetoresistive sensing element string, and the magnetoresistive sensing element strings are electrically connected to form one or more bridge arms of the sensor bridge; or the sensor bridge includes a single chip, and bridge arms constituting the sensor bridge are deposited on the single chip.

It should be noted that the FM1 layer and the FM2 layer have different remanent moment products Mrt. When there is no external magnetic field, even if the AC reference power signal is the largest, the magnetic field generated by the modulating current at the sensor location is also the smallest. The magnetic field generated by the modulating current at the sensor location is unaffected by the AC reference power supply.

It should be noted that, when the AC reference power signal is in an operating frequency range, the magnetoresistive sensor elements produce white noise with a frequency much greater than the frequency of 1/f noise. By increasing the size of the sensor, the area increase can reduce the 1/f noise.

The present invention uses an RKKY coupled FM stack form in which the modulating current output by the modulator changes the permeability of the magnetoresistive sensor and thus modulates the magnetic field. Moreover, in the present invention, modulation can be carried out prior to detection by the sensor elements, ensuring that the modulating signal is within a corresponding linear region of the magnetoresistive sensor.

The above embodiments are only used for illustrating rather than limiting the technical solutions of the present invention. Although the present invention is described in detail with reference to the foregoing embodiments, those of ordinary skill in the art should understand that they still can make modifications to the technical solutions disclosed in the foregoing embodiments or make equivalent substitutions to part of technical features thereof; and such modifications or substitutions should not cause the essence of the corresponding technical solutions to depart from the spirit and scope of the technical solutions of the embodiments of the present invention.

The invention claimed is:

1. A modulated magnetoresistive sensor comprising:
a substrate disposed on an XY plane,
magnetoresistive sensing elements,
a modulator,
electrical connectors,
an electrically insulating layer, and
bonding pads deposited on the substrate,
wherein a sensing direction of the magnetoresistive sensing elements is parallel to an X axis of the XY plane;
wherein the magnetoresistive sensing elements are connected in series to form magnetoresistive sensing element strings, the magnetoresistive sensing element strings are electrically connected to form a sensor bridge which is a push-pull half-bridge circuit or a push-pull full-bridge circuit;
wherein the magnetoresistive sensing element strings are electrically connected to the bonding pads such that a bias voltage or current flows through the magnetoresistive sensing elements and the bias voltage or current on the magnetoresistive sensing elements is detected;
wherein the modulator is electrically connected to the bonding pads, a modulating current is obtained from the bonding pads, the direction of the modulating current is parallel to a Y axis, the modulator causes the modulating current to pass through a conductor around a soft ferromagnetic flux concentrator so that a magnetic field is generated around the soft ferromagnetic flux concentrator to modulate the permeability of the soft ferromagnetic flux concentrator, and the electrically insulating layer is set between the modulator and the magnetoresistive sensing elements to separate the modulator from the magnetoresistive sensing elements.

2. The modulated magnetoresistive sensor according to claim 1,
wherein the magnetoresistive sensing elements are AMR, GMR or TMR magnetic sensing elements;
wherein the modulator is composed of multiple elongated modulating assemblies, each in the structure of a rectangular strip with a long axis parallel to the Y-axis direction and a short axis parallel to the X-axis direction, the multiple elongated modulating assemblies are arranged in an array, there are gaps between the elongated modulating assemblies, the direction of spacing distance of the gaps is along the X-axis direction, and the ends of the elongated modulating assemblies are connected by the electrical connectors to form a serpentine current path.

3. The modulated magnetoresistive sensor according to claim 2,
wherein each of the elongated modulating assemblies is a three-layer structure consisting of an FM1 layer, an NM layer, and an FM2 layer, wherein the FM1 layer and the FM2 layer are soft ferromagnetic layers, and the NM layer is a normal metal layer;
wherein the NM layer is made of tantalum or copper, the thickness of the NM layer is less than 5 nm, and RKKY coupling exists between the FM1 layer and the FM2 layer.

4. The modulated magnetoresistive sensor according to claim 3,
wherein the electrical connectors are made of a metal, and the electrical connectors are connected to an upper surface, a lower surface or side surface of the modulator; or
wherein the electrical connectors are etched from the three-layer structures each consisting of the FM1 layer, the NM layer, and the FM2 layer.

5. The modulated magnetoresistive sensor according to claim 1, wherein the modulator comprises a current carrying coil and a rectangular ferromagnetic body, the current carrying coil is located above the rectangular ferromagnetic body, and the current carrying coil is connected to a bonding pad.

6. The modulated magnetoresistive sensor according to claim 3,
wherein the sensor further comprises an AC reference power supply;
wherein the AC reference power supply periodically drives the elongated modulating assemblies in the sensor, an analog front end circuit, a low pass filter and a mixer at a frequency f;
wherein the analog front end circuit comprises a front end circuit and an amplifier, and the front end circuit is capacitively coupled to an output terminal of the magnetoresistive sensor;
wherein an input terminal of the mixer is electrically connected to the AC reference power supply and an output terminal of the front end circuit;
wherein an input terminal of the low pass filter is electrically connected to an output terminal of the mixer, an output terminal of the low pass filter provides an output signal, and the output signal corresponds to the amplitude and polarity of a magnetic field detected by the magnetoresistive sensing elements.

7. The modulated magnetoresistive sensor according to claim 6, further comprising an optimized filter electrically connected to an AC reference power signal or an input signal of the mixer; and
the optimized filter adjusts the reference power signal by removing a portion of frequency components before the AC reference power signal enters a mixer circuit and by converting the AC reference power signal into an AC voltage signal.

8. The modulated magnetoresistive sensor according to claim 7, wherein the AC reference power signal is unipolar, the low pass filter is connected to the output terminal of the mixer, and the low pass filter has a low-frequency cutoff frequency of F.

9. The modulated magnetoresistive sensor according to claim 7, wherein the AC reference power signal is bipolar, the magnetoresistive sensor further comprises a frequency multiplier, the frequency multiplier is electrically connected with the AC reference power supply and the input terminal of the mixer, the low pass filter is connected with the output terminal of the mixer, and the low pass filter has a low-frequency cutoff frequency of 2F.

10. The modulated magnetoresistive sensor according to claim 1,
wherein the sensor bridge comprises a single chip, and bridge arms constituting the sensor bridge are deposited on the single chip; or
wherein the sensor bridge comprises two or more interconnected chips, each independent chip comprises a magnetoresistive sensing element string, and the magnetoresistive sensing element strings are electrically connected to form one or more bridge arms of the sensor bridge.

11. The modulated magnetoresistive sensor according to claim 7, wherein when the AC reference power signal is in an operating frequency range, the magnetoresistive sensor elements produce white noise with a frequency much greater than the frequency of 1/f noise.

12. The modulated magnetoresistive sensor according to claim 7,
wherein the FM1 layer and the FM2 layer have different remanent moment products Mrt;
wherein when there is no external magnetic field, even if the AC reference power signal is the largest, the magnetic field generated by the modulating current at the sensor location is also the smallest.

* * * * *